United States Patent [19]
Ishigami

[11] Patent Number: 5,886,653
[45] Date of Patent: Mar. 23, 1999

[54] DIFFERENTIAL DECODER CIRCUIT

[75] Inventor: Junichi Ishigami, Tokyo, Japan

[73] Assignee: NEC Corporation, Tokyo, Japan

[21] Appl. No.: 688,034

[22] Filed: Jul. 26, 1996

[30] Foreign Application Priority Data

Jul. 26, 1995 [JP] Japan .................................. 7-189649

[51] Int. Cl.⁶ .............................................. H03K 19/086
[52] U.S. Cl. ........................................... 341/76; 341/144
[58] Field of Search .............................. 341/76, 144, 145, 341/172

[56] References Cited

U.S. PATENT DOCUMENTS

| | | | |
|---|---|---|---|
| 4,571,508 | 2/1986 | Koga et al. | 307/360 |
| 5,075,567 | 12/1991 | Kubota | 307/255 |
| 5,138,318 | 8/1992 | Hatsuzawa | 341/156 |
| 5,237,214 | 8/1993 | Usami | 304/454 |

Primary Examiner—Jeffrey A. Gaffin
Assistant Examiner—Peguy JeanPierre

[57] ABSTRACT

Disclosed is a differential decoder circuit, which has: a pair of first and second transistors which form a differential connection, wherein a base of the first transistor is supplied with a reference bias voltage and a base of the second transistor is supplied with an input signal to be decoded to thereby output a decode output depending on the input signal from collector outputs of the first and second transistors; a constant-voltage source; a first bias means for supplying a bias voltage determined by a constant voltage of the constant-voltage source with the base of the first transistor; and a second bias means for supplying the alternative of a voltage determined by the input signal and the voltage determined by the constant voltage depending on a level of the input signal with the base of the second transistor.

6 Claims, 4 Drawing Sheets

23, 24, 29 : CONSTANT-CURRENT SOURCES    18 ~ 21 : COLLECTOR RESISTANCES

DIFFERENTIAL DECODER CIRCUIT

FIELD OF THE INVENTION

This invention relates to a differential decoder circuit, and more particularly to, a differential decoder circuit in which a base of one of a pair of transistors which form a differential connection is supplied with a reference bias voltage and a base of the other transistor is supplied with an input signal to be decoded to thereby output a decoded output depending on the input signal from collector outputs of the transistors.

BACKGROUND OF THE INVENTION

A conventional differential decoder circuit comprises a pair of differential PNP transistors which are supplied with an operating current by a constant-current source and have emitters commonly connected, wherein an input signal to be decoded is applied to the base input of one of the transistors and a voltage of a constant-voltage source is applied to the base input of the other of the transistors. The transistors compose the first-stage differential circuit. Further, each of collectors of the transistors is connected with the second-stage differential circuit. The differential circuit connected to one of the collectors is composed of PNP transistors, in which the other input signal to be decoded is applied to the base input of a transistor and a voltage of a constant-voltage source is applied to the base of the other transistor. Also, the differential circuit connected to the other collector of the transistors is composed of PNP transistors, in which the voltage of the constant-voltage source is applied to the base of a transistor and the other input signal is applied to the base of the other transistor.

From the collector resistances of the second-stage transistors, the respective decoded output signals to the 2-bit input signals are taken out.

However, when the logical amplitude signals with high-level Vcc and low-level 0V are input, it does not operate stably. Therefore, it needs, for example, means for converting the CMOS(complementary MOS) logic level into the ECL(emitter-coupled logic) level.

This example is composed of two-stage differential circuits. In the case of multi-bit inputs, where the multistage composition is needed, it is difficult for the number of stages of differential connection to be increased since the power source is limited. Also, it cannot provide a high potential output.

SUMMARY OF THE INVENTION

Accordingly, it is an object of the invention to provide a differential decoder circuit in which the number of stages of differential connection can be increased without requiring a high power source and a high potential output can be obtained when multi-bit input signals need to be decoded.

According to the invention, a differential decoder circuit, comprises:

a pair of first and second transistors which form a differential connection, wherein a base of the first transistor is supplied with a reference bias voltage and a base of the second transistor is supplied with an input signal to be decoded to thereby output a decode output depending on the input signal from collector outputs of the first and second transistors;

a constant-voltage source;

a first bias means for supplying a bias voltage determined by a constant voltage of the constant-voltage source with the base of the first transistor; and a second bias means for supplying the alternative of a voltage determined by the input signal and the voltage determined by the constant voltage depending on a level of the input signal with the base of the second transistor.

According to another aspect of the invention, a differential decoder circuit, comprises:

a plurality of n-stage differential circuits which are longitudinally connected, wherein n is two or more, and include a pair of first and second transistors, respectively, which form a differential connection, respective bases of the first transistor being supplied with a predetermined reference bias voltage, wherein a base of the second transistor of each of the n-stage differential circuits is supplied with an input signal to be decoded to thereby output a decode output depending on the input signal from collector outputs of the first and second transistors of stage number n;

a constant-voltage source;

a first bias means for supplying a bias voltage determined by a constant voltage of the constant-voltage source with the base of the first transistor of each of the n-stage differential circuits; and a second bias means for supplying the alternative of a voltage determined by the input signal and the voltage determined by the constant voltage depending on a level of the input signal with the base of the second transistor of each of the n-stage differential circuits.

In accordance with the invention, one of the bases of a pair of transistors is supplied with the reference bias voltage determined by the constant-voltage source, and the other base is supplied with the alternative of the bias voltage (clamp voltage) determined by the constant voltage and the voltage determined by the input voltage depending on a level of the input signal. Therefore, the differential decoder circuit of the invention stably operates even when the logical amplitude signals with high-level Vcc and low-level 0V are input.

Furthermore, by setting the potential difference between the bases of the differential connection transistors to be $V_{BE}/2$ ($V_{BE}$ means the base-emitter voltage of the bipolar transistor), the connection stages of differential circuits which are necessary for multi-bit inputs can be increased without requiring a high power source and a high potential output can be obtained.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a differential decoder circuit in the preferred embodiments, the aforementioned conventional differential decoder circuit will be explained in FIG. 1.

Figure 1:
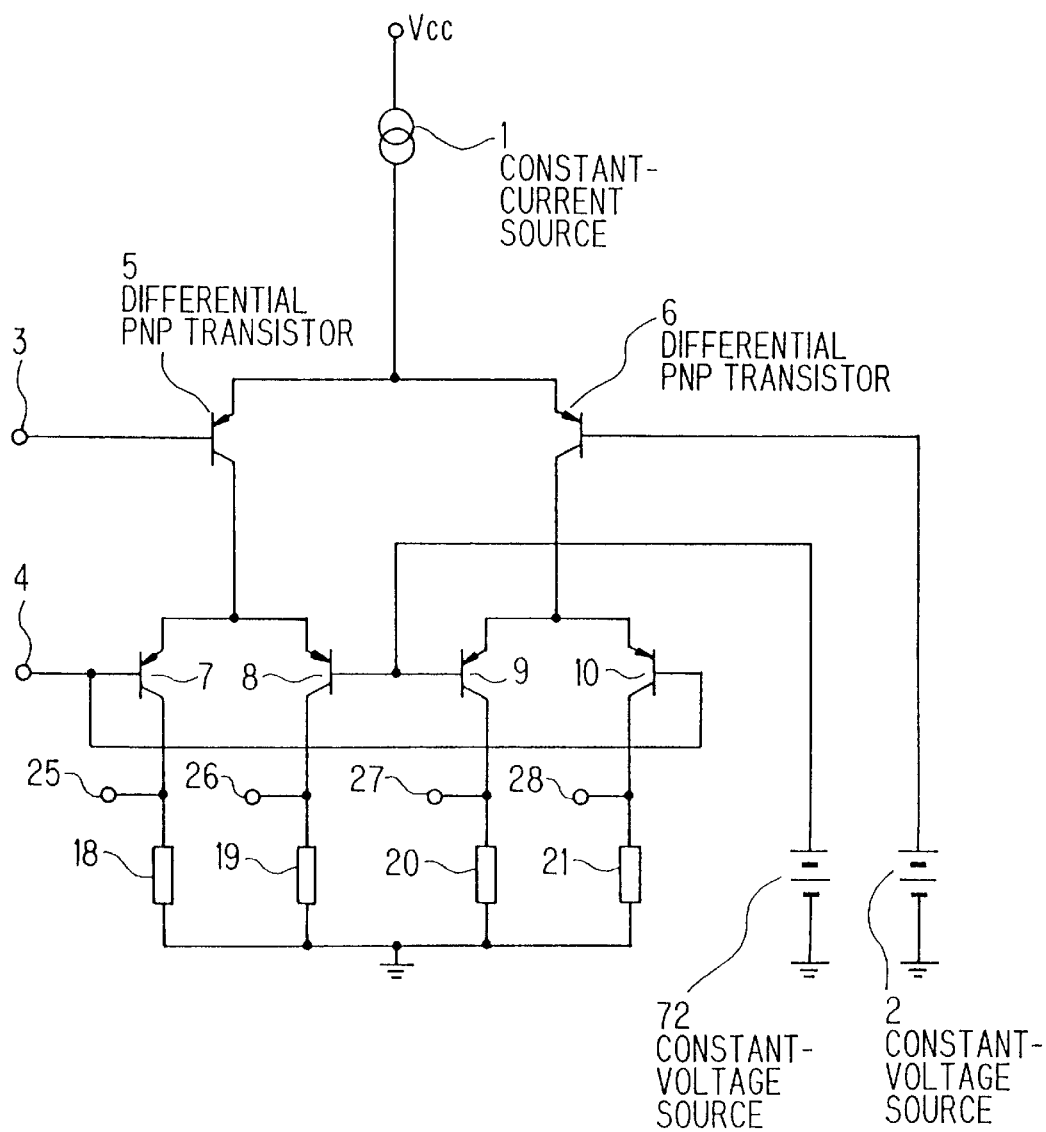
FIG. 1 is a circuit diagram showing a conventional differential decoder circuit.

In FIG. 1, a pair of differential PNP transistors 5, 6 which are supplied with an operating current by a constant-current source 1 have emitters commonly connected and an input signal to be decoded is applied to the base input 3 of the transistor 5. To the base of the transistor 6, a voltage of the constant-voltage source 2 is applied. The transistors 5, 6 compose the first-stage differential circuit.

Each of collectors of the transistors 5, 6 is connected with the second-stage differential circuit. The differential circuit connected to the collector of the transistor 5 is composed of PNP transistors 7, 8, in which the other input signal to be decoded is applied to the base input 4 of the transistor 7 and a voltage of the constant-voltage source 72 is applied to the base of the transistor 8. On the other hand, the differential circuit connected to the collector of the transistor 6 is composed of PNP transistors 9, 10, in which the voltage of the constant-voltage source 72 is applied to the base of the transistor 9 and the signal at the input 4 is applied to the base of the transistor 10.

From the collector resistances 18 to 21 of the transistors 7 to 10 of the second-stage differential circuit, the respective decoded outputs 25 to 28 to the 2-bit inputs 3, 4 are taken out.

In the above composition, when a high-level voltage, i.e., Vcc which is an operating voltage of the circuit, is input from the input for the first-stage differential circuit, the base potential of the transistor 5 becomes higher than that of the transistor 6 to turn on the transistor 6. Due to the turning-on of the transistor 6, the current of the constant-current source 1 is flown to the transistor 9 or 10 of the second differential circuit.

In this stage, if the input 4 for the second differential circuit is high level, the transistor 9 turns on to flow the current into the collector resistance 20 to make only the output 27 high level.

Thus, depending on the combination of the levels of the 2-bit inputs 3, 4, the high-level output occurs only at one of the outputs 25 to 28 to operate the 2-bit differential decoder circuit.

In this example, when 0V is applied to the input 3 for the first differential circuit, the current is flown into the transistor 5. However, the current is flown into the base of the transistor of the second differential circuit to prevent the transistor from normally operating, thereby failing to get the output.

Next, a differential decoder circuit in the first preferred embodiment will be explained in FIG. 2, wherein like parts are indicated by like reference numerals as used in FIG. 1. The respective connection relations between a constant-current source 1, differential pair transistors 5, 6 of the first-stage differential circuit, differential pair transistors 7 to 10 of the second-stage differential circuit and collector resistances 18 to 21 are the same as in FIG. 1.

Here, the invention is characterized in base bias circuits for the respective transistors. The base bias for the transistor 5 of the first-stage differential circuit is supplied by the emitter output of the NNF transistor 13 which is turned on or off by the input 3. Also, supplied is the voltage that the voltage of the constant-voltage source 2 is level-shifted by each $V_{BE}(2 \cdot V_{BE})$ in NPN transistors 11, 14. Which voltage is used as the base bias for the transistor 5 is determined by the signal level in the base input 3 of the transistor 13. The base bias for the transistor 6 of the first-stage differential circuit is supplied by the voltage that the voltage of the constant-voltage source 2 is level-shifted by $V_{BE}$ in the transistor 11.

The base bias for the transistors 7, 10 of the second-stage differential circuit is supplied by the voltage that the voltage of the input 4 is level-shifted by each $V_{BE}(2 \cdot V_{BE})$ in NPN transistors 15, 17. Also, supplied is the voltage that the voltage of the constant-voltage source 2 is level-shifted by each $V_{BE}(3 \cdot V_{BE})$ in the NPN transistors 11 to 16. Which voltage is used as this base bias for the transistors 7, 10 is determined by the signal level in the base input 4 of the transistor 15.

The base bias for the transistors 8, 9 of the second-stage differential circuit is supplied by the voltage that the voltage of the constant-voltage source 2 is level-shifted by each $V_{BE}(2 \cdot V_{BE})$ in the transistors 11, 12.

A constant-current source 23 produces the operating current for the transistors 13, 14, a constant-current source 24 produces the operating current for the transistors 15 to 16 and a constant-current source 29 produces the operating current for the transistors 11, 12.

In operation, when a low input(0V) is input from the input 3, the transistor 13 cuts off it to provide the base of the transistor 5 with [constant voltage—$2 \cdot V_{BE}$] through the emitter follower of the transistor 14. When a high input(Vcc) is input from the input 3, the base of the transistor 5 is provided with [input voltage—$V_{BE}$] through the emitter follower of the transistor 13.

Namely, when the input signal from the input 3 is low, the relation of [the base potential of the Transistor 5]<[the base potential of the transistor 6] is formed to flow the current supplied by the constant-current source through the transistor 5 into the second differential circuit. On the other hand, when the input signal from the input 3 is high, the relation of [the base potential of the transistor 5]>[the base potential of the transistor 6] is formed to flow the current supplied by the constant-current source 1 through the transistor 6 into the second differential circuit.

In the second differential circuit, when the input 4 is low, the transistor 15 cuts off it to provide the bases of the transistors 7, 10 with [constant voltage—$3 \cdot V_{BE}$] through the emitter follower of the transistor 16. On the other hand, when the input 4 is high, the bases of the transistors 7, 10 are provided with [input voltage—$2 \cdot V_{BE}$] through the transistor 17.

Namely, when the input signal from the input 4 is low, the relation of [the base potential of the transistor 7 or 10]<[the base potential of the transistor 8, 9] is formed to flow the current supplied from the first-stage differential circuit into the transistor 7 or 10. On the other hand, when the input signal from the input 4 is high, the relation of [the base potential of the transistor 7 or 10]>[the base potential of the transistor 8, 9] is formed to flow the current into the transistor 8 or 9.

As explained above, one of the differential connection transistors in the second-stage differential circuit is selected to flow the current supplied from the constant-current source 1 into one of the resistances 18 to 21 connected with the collectors of the respective transistors. Due to the voltage drop in a resistance selected, a high output is obtained from one of outputs 25 to 28.

Meanwhile, when the input is high, the currents supplied from the constant-current sources 23, 24 flow through the transistor 13 and the transistors 15, 17, respectively. When the input is low, they flow through the transistors 14, 16, respectively. The current supplied from the constant-current source 29 always flows through the transistors 11, 12 to make constant the base potential of the transistors 6, 8 and 9 which belong to one side of the differential connection transistors.

A differential decoder circuit in the second preferred embodiment will be explained in FIG. 3, wherein like parts are indicated by like reference numerals as used in FIG. 2. The differential decoder circuit is a 2-bit decoder circuit which is composed of two-stage differential transistors similar to the differential decoder circuit in the first embodiment.

Figure 3:
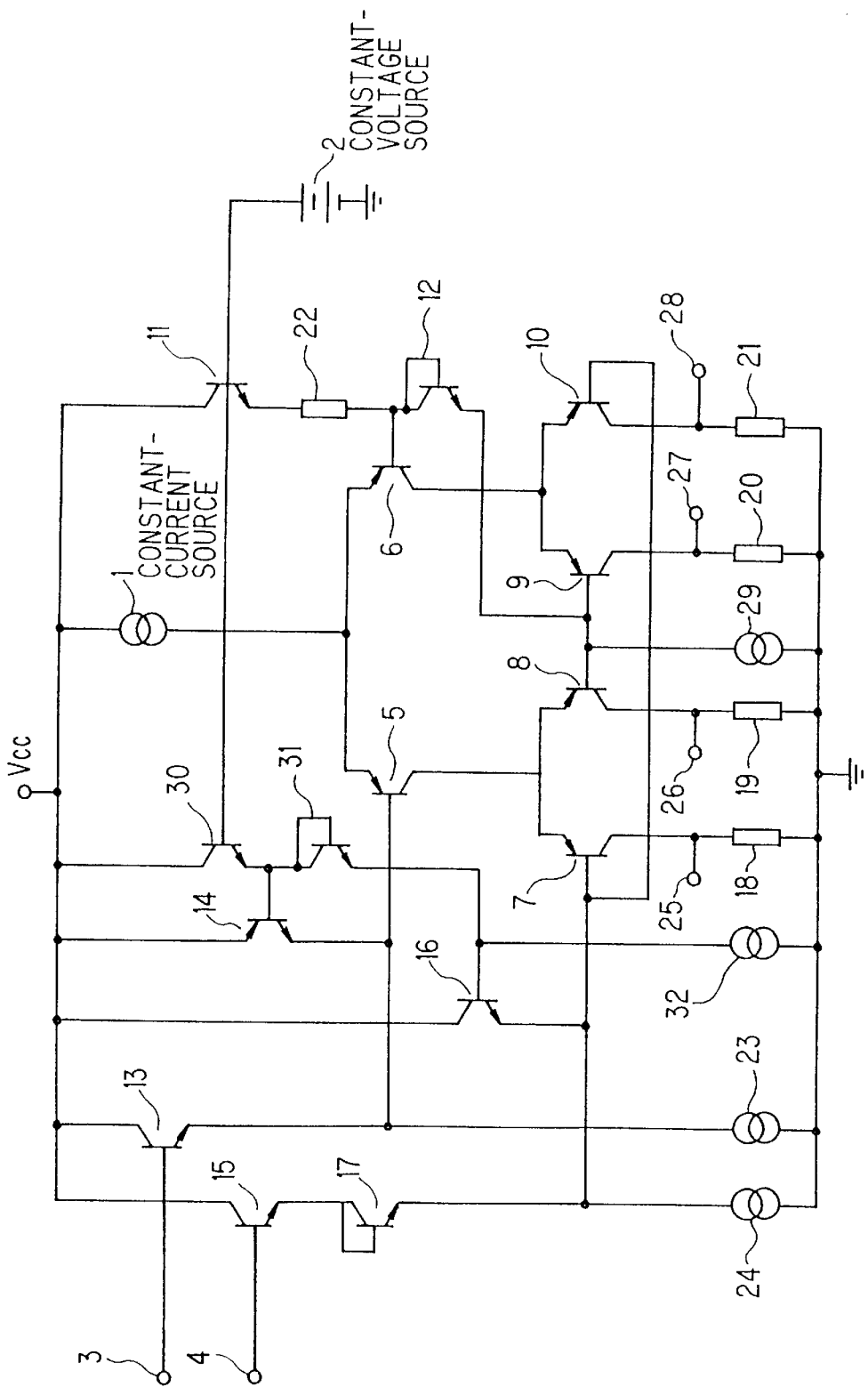
FIG. 3 is a circuit diagram showing a differential decoder circuit in a second preferred embodiment according to the invention.

In FIG. 3, a resistance 22 located between the emitter of a transistor 11 and the base of a transistor 6 is added. The current flowing through the resistance 22(from a constant-current source 29) is preset to make the voltage drop in the resistance 22 to be $V_{BE}/2$. Therefore, the base of the transistor 6 is supplied with the voltage [constant voltage—$2/3 \cdot V_{BE}$].

Here, the base of a transistor 14 is supplied with the voltage of a constant-voltage source 2 through the emitter of a NPN transistor 30. The base of a transistor 16 is supplied with the voltage of a transistor 30 through a NPN transistor 31. A constant-current source 32 produces the operating current of the transistors 30, 31.

Figure 2:
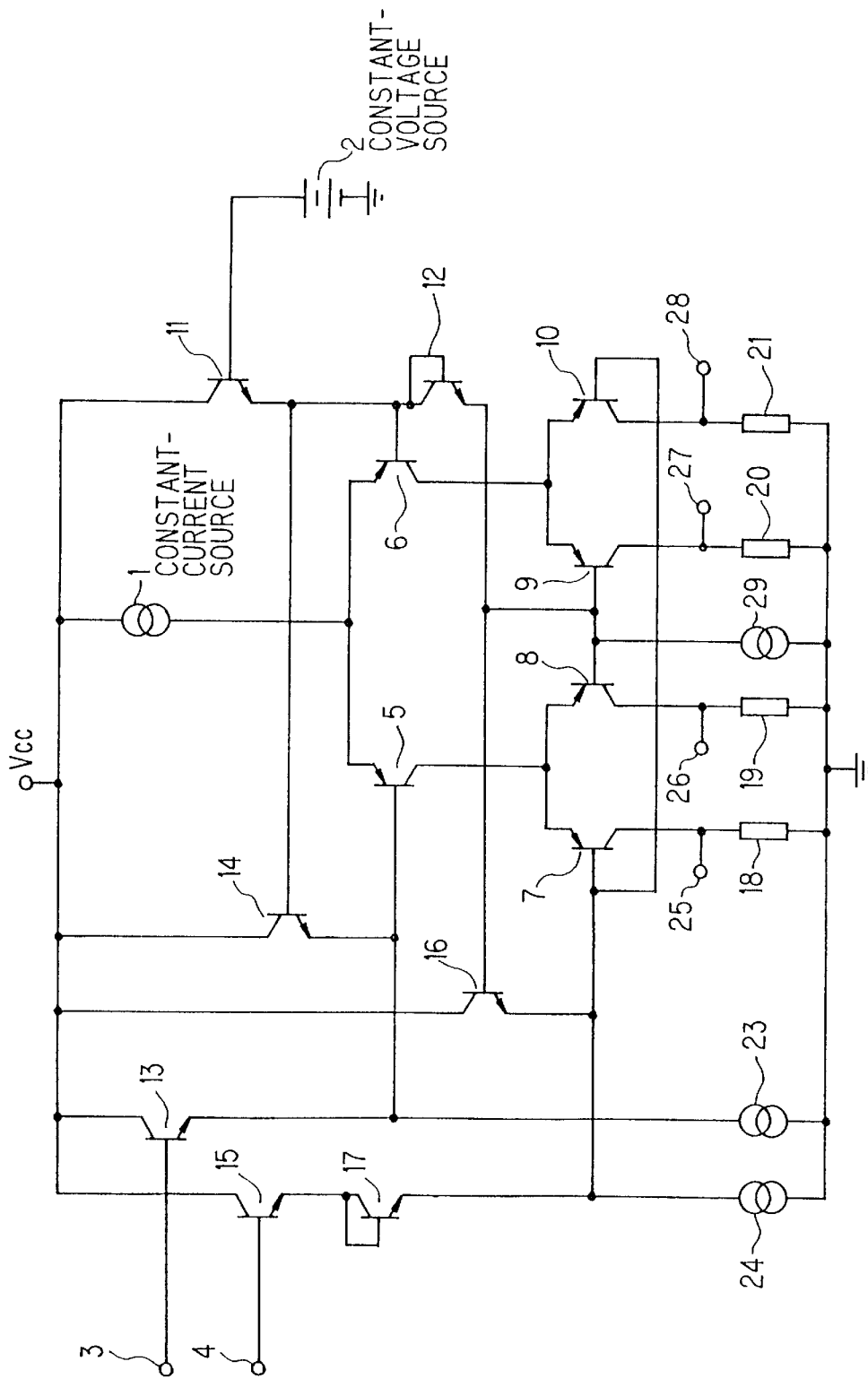
FIG. 2 is a circuit diagram showing a differential decoder circuit in a first preferred embodiment according to the invention.

The other composition is the same as in FIG. 2, therefore the explanation is omitted.

Figure 4:
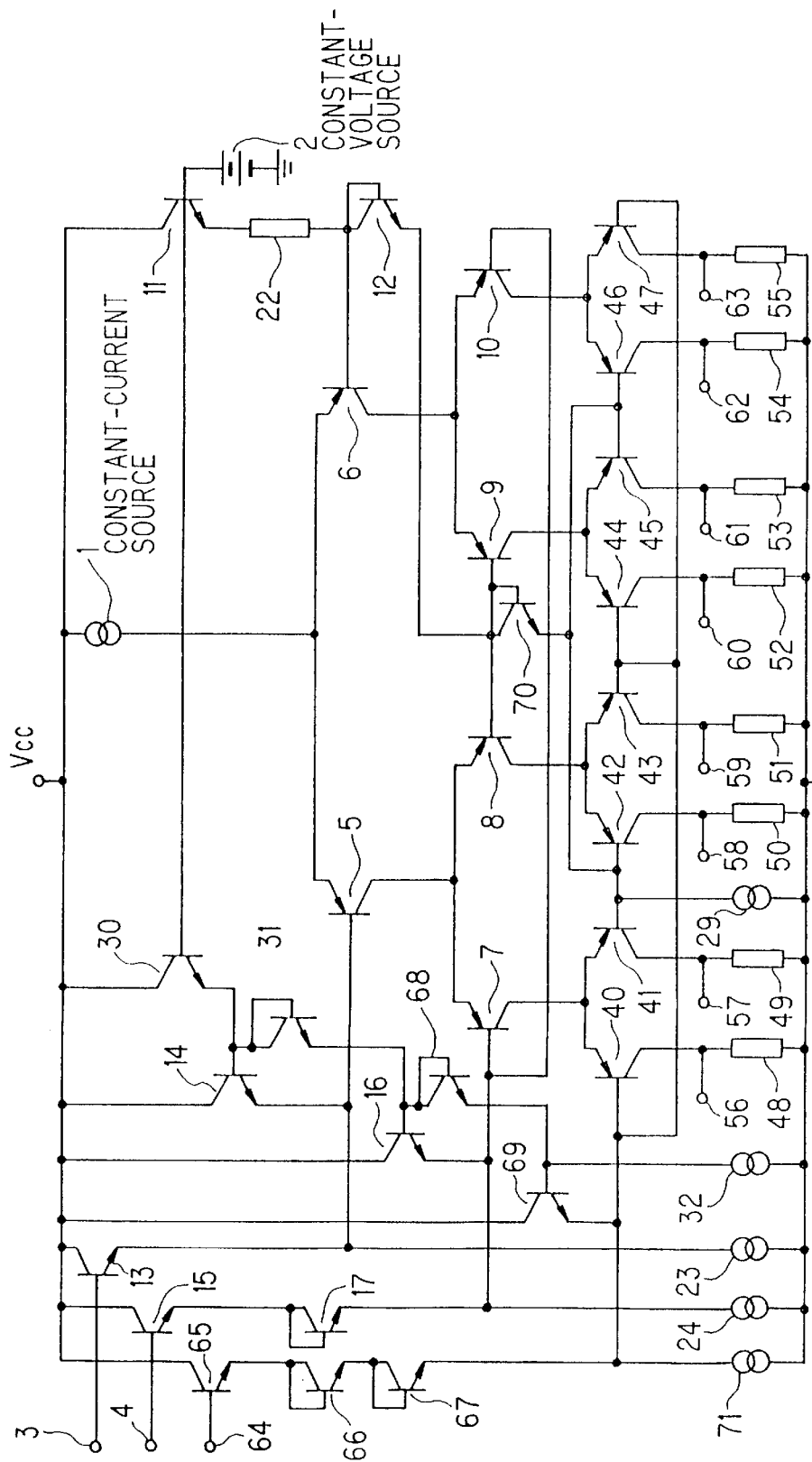
FIG. 4 is a circuit diagram showing a differential decoder circuit in a third preferred embodiment according to the invention.

In operation, the bases of the transistors 8, 9 of the second-stage differential circuit are supplied with [constant voltage—$5/2 \cdot V_{BE}$] through a transistor 12. When the input signals from inputs 3, 4 are low(0V) and transistors 13, 15 cut off them, the base of a transistor 5 of the first-stage differential circuit is supplied with [constant voltage—$2 \cdot V_{BE}$] through the emitter followers of the transistors 30, 14, and the bases of transistors 7, 10 are supplied with [constant voltage—$3 \cdot V_{BE}$] through the transistors 30, 31 and 16.

in the second embodiments since the potential difference between the bases of the differential pair transistors is set to be $V_{BE}/2$, the power source voltage Vcc does not need to be high even when the multistage differential connection for inputting multi-bit signals is provided compared with the first embodiment($V_{BE}$). Namely, when the same voltage is provided, the circuit composition with more stages can be realized. Also, a high potential output can be obtained, A differential decoder circuit in the third preferred embodiment will be explained in FIG. 4, wherein like parts are indicated by like reference numerals as used in FIG. 3. This is an example of three-stage differential connection for 3-bit input signals.

An input 64 other than inputs 3, 4 is added to input the 3-bit signals, therefore being provided with four third-stage differential circuits. The differential circuits are composed of transistors 40 to 47 and 8-bit decoder outputs 56 to 63 are obtained from collector resistances 48 to 55, respectively.

Furthermore, NPN transistors 65 to 67 and transistors 68, 69 are added as the base bias to transistors 40, 43, 44 and 47 which belong to one side of the third-stage differential connection transistors. Also, a constant-current source 71 is added as the operating current source for the transistors.

A NPN transistor 70 is added as the base bias to transistors 41, 42, 45 and 46 which belong to the other side of third-stage differential connection transistors. Also, a constant-current source 29 is added as the operating current source for the transistors.

In the above composition, similarly to the circuits in the first and second embodiments, a circuit source voltage Vcc of 5V and constant-voltage source 2 of 4 to 5 V are used to reduce the voltage.

Alternatively, in the first and second embodiments, where the differential switches are composed of PNP transistors and the clamp circuits are composed of NPN transistors, the PNP and NPN transistors may be substituted each other to obtain the same effect.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A differential decoder circuit, comprising:
    a pair of first and second transistors which form a differential connection, wherein a base of said first transistor is supplied with a reference bias voltage and a base of said second transistor is supplied with an input signal to be decoded to thereby output a decode output depending on said input signal from collector outputs of said first and second transistors;
    a constant-voltage source;
    a first bias means for supplying a bias voltage determined by a constant voltage of said constant-voltage source with said base of said first transistor; and
    a second bias means for supplying the alternative of a voltage determined by said input signal and said voltage determined by said constant voltage depending on a level of said input signal with said base of said second transistor.

2. A differential decoder circuit, according to claim 1, wherein:
    each of said first and second bias means has an emitter follower circuit in which said constant voltage of said constant-voltage source is input into a base of said emitter follower circuit.

3. A differential decoder circuit, comprising:
    a plurality of n-stage differential circuits which are longitudinally connected, wherein n is two or more, and include a pair of first and second transistors, respectively, which form a differential connection, respective bases of said first transistor being supplied with a predetermined reference bias voltage, wherein a base of said second transistor of each of said n-stage differential circuits is supplied with an input signal to be decoded to thereby output a decode output depending on said input signal from collector outputs of said first and second transistors of stage number n;
    a constant-voltage source;
    a first bias means for supplying a bias voltage determined by a constant voltage of said constant-voltage source with said base of said first transistor of each of said n-stage differential circuits; and
    a second bias means for supplying the alternative of a voltage determined by said input signal and said voltage determined by said constant voltage depending on a level of said input signal with said base of said second transistor of each of said n-stage differential circuits.

4. A differential decoder circuit, according to claim 2, wherein:
    each of said first and second bias means has an emitter follower circuit in which said constant voltage of said constant-voltage source is input into a base of said emitter follower circuit.

5. A differential decoder circuit, according to claim 2, further comprising:
    means for setting a potential difference between bases of said first and second transistors of each of said differential circuits to be ½ of a base-emitter voltage of said transistors.

6. A differential decoder circuit, according to claim 5, wherein:

said potential difference setting means includes a resistance and a constant-current source for supplying a low current, and potential difference between both ends of said resistance is set to be ½ of said base-emitter voltage.

* * * * *